United States Patent
James

[11] 3,939,411
[45] Feb. 17, 1976

[54] INSTANTANEOUS FREQUENCY MEASUREMENT SYSTEM

[75] Inventor: Wilbur G. James, Falls Church, Va.

[73] Assignee: The United States of America as represented by the Secretary of the Navy, Washington, D.C.

[22] Filed: Oct. 3, 1974

[21] Appl. No.: 511,816

[52] U.S. Cl............................ 324/77 H; 324/78 D
[51] Int. Cl.².......................................... G01R 23/02
[58] Field of Search.... 324/77 R, 77 B, 77 D, 77 H, 324/78 D

*Primary Examiner*—John Kominski

[57] ABSTRACT

An improved instantaneous frequency measurement system which can measure pulse signals of differing frequencies emitted simultaneously by a single source. A conventional instantaneous frequency measurement detector is preceded by a gating device and a dispersive delay line which cooperate to transform the simultaneous signals into time sequential signals.

9 Claims, 2 Drawing Figures

INSTANTANEOUS FREQUENCY MEASUREMENT SYSTEM

BACKGROUND OF THE INVENTION

It is very often desirable, in the field of electronic countermeasure warfare, to determine the frequency of a received signal as, for example, when one wishes to produce a jamming signal of the same frequency as a signal being emitted by an enemy. These emitted signals are not always merely of a single, constant frequency, but often vary in frequency in a predetermined manner. Therefore, in order to effectively jam such signals, one must accurately and quickly determine the frequency of the originally emitted signal. There have been developed in the past various forms of panoramic scanning receivers which scan the frequency spectrum of interest in search of the frequency of the emitted signal which is desired to be jammed. Obviously, such frequency scanning is relatively slow and this time lag may often prove fatal to attempts at producing effective jamming signals.

There is now currently in use a different technique for determining the unknown frequency of a received signal, this technique has the descriptive title of instantaneous frequency measurement. Equipment utilizing this well-known technique can provide frequency information in such a short period of time that highly effective jamming signals may be produced and transmitted. This instantaneous frequency measurement technique utilizes a detector having a signal delay element, i.e., a frequency sensitive phase shifter, and a radio frequency phase difference sensor. An emitted signal is received and divided into two equal components. One signal component is fed through the delay line, and the other signal component is fed to the phase sensor. The phase difference between the two components is then measured. The magnitude of the measured phase difference is related by a known amount to the unknown frequency of the received signal. Since this relationship between a frequency and its attendant phase shift in the delay line is known, the phase difference signal can be processed and then fed to a voltage controlled oscillator to produce a jamming signal having an identical frequency to that of the originally received signal.

While the instantaneous frequency measurement technique has many advantages, unfortunately, a conventional system cannot properly handle simultaneously received pulse signals. It is fairly common for many modern radars to simultaneously emit pulse signals of two or more frequencies, resulting in their arriving simultaneously at an intercept receiver. This reception of two simultaneously emitted pulse signals of different frequencies causes the instantaneous frequency measurement unit to become hopelessly confused, and it cannot even determine the frequency of either of the two signals, provided they are of relatively equal strength. One solution to this problem is to precede the instantaneous frequency measurement detector with a conventional, electrically tuned, YIG rejection filter. This YIG filter is swept at a fixed rate across the band suspected to contain a dual frequency emitter signal. By properly selecting the filter bandwidth and the sweep rate, it should be possible to see individually each frequency of the two simultaneously received signals at least once each sweep. This filter sweeping concept is similar to the sweeping heterodyne panoramic receiver and hence contains the deficiencies of these past systems. There are other problems which are also introduced in the solving of the original dual signal problem which make this sweeping filter solution less than the best possible solution.

SUMMARY OF THE INVENTION

The present invention relates to an improvement for use on an instantaneous frequency measurement system. More particularly, it permits such system to accept and properly interpret two or more pulse signals of different frequency which have been simultaneously received. The invention provides apparatus which precedes the instantaneous frequency measurement detector, and which serves to separate multiple frequency pulse signals into time sequential signals. The invention employs a dispersive microwave delay line to accomplish this signal separation. As is well-known, a dispersive delay line performs the function of delaying or phase shifting low frequencies for a time which is not equal to the phase shift for higher frequencies. A typical dispersive delay line might comprise a tapped delay line with each tap being connected to a filter having a different narrow frequency pass band. It is possible then to obtain a dispersive delay line which will delay low frequencies longer than it will delay higher frequencies, or conversely, one which operates such that higher frequencies are delayed longer than lower frequencies. Such a dispersive delay line is taught by U.S. Pat. No. 2,882,395. As that reference discloses, the dispersive delay line performs two operations. First, it separates the component frequencies of a multiple frequency signal and, second, transmits each separated frequency component at a delayed time determined by the component's frequency.

Upon receiving a dual frequency emitter signal containing frequencies, e.g., $f_1$ and $f_2$, if only the first 100 nanoseconds of the signal is permitted to enter the delay line, and the delay line is such that $f_1$ requires 150 nanoseconds longer to be fed through the dispersive delay line than does $f_2$, then the instantaneous frequency measurement detector will produce two time sequential outputs, one for each frequency, and each output will be correct for its associated frequency. Single frequency and high-multiple frequency signals can be processed satisfactorily if the delay line is chosen with the appropriate dispersion characteristics. The addition of the apparatus provided by the invention to a conventional instantaneous frequency measurement system will not affect any of the other desirable features of the measurement system.

It is therefore an object of the present invention to provide an improved instantaneous frequency measurement system which can accept and accurately measure multiple, simultaneously received signals of differing frequencies.

It is another object of the present invention to provide an improved instantaneous frequency measurement system which will separate multiple frequency signals received simultaneously into time sequential signals.

It is a further object of the present invention to provide a dispersive delay line which precedes a conventional instantaneous frequency measurement detector to permit accurate measurement of multiple simultaneously received pulse signals of different frequencies.

It is still a further object of the present invention to provide a gating device which allows only a small portion of a received pulse signal to enter a dispersive delay line which precedes a conventional instantaneous frequency measurement detector to permit accurate measurement of multiple simultaneously emitted signals of different frequencies.

DESCRIPTION OF THE PREFERRED EMBODIMENT

Figure 1:
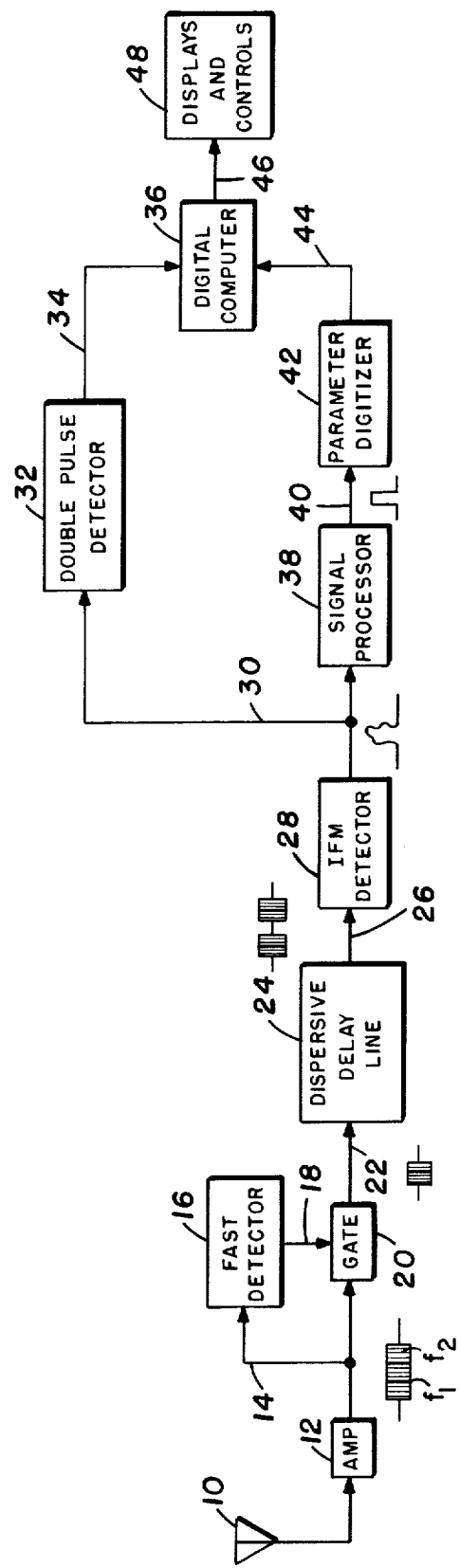
FIG. 1 is a block diagram showing the preferred embodiment of the invention.

Referring now to FIG. 1, the preferred embodiment of the invention is shown in block diagram form. Simultaneously received pulse signals of different frequencies are received by a standard omni antenna 10 and increased in amplitude by amplifier 12. The amplified signal is fed on line 14 to a fast detector 16 which detects the leading edge of the pulse signal and produces an on-off signal on line 18. Such leading edge detection is well-known in pulse radar technology and is discussed in paragraph 25–57 in Fink's *Electronic Engineers' Handbook*, McGraw-Hill, First Edition, 1957. It is also discussed in paragraphs 21–41 and 21–42 of the *Radar Handbook* by Skolnick, 1970. Simply stated, the fast detector is a threshold switching device which turns on when a given voltage level is reached and off again when a controlled period of time has passed. This on-off signal on line 18 is used to control a solid-state switch or gate 20, which is also connected to receive the amplified input signal on line 14. The on-off signal on line 18 turns on the gate 20 so that only a small portion of the input signal on line 14 is passed onto line 22 by the gate 20. Typically, the first 100 nanoseconds of the signal will be permitted to pass onto line 22.

Figure 2:
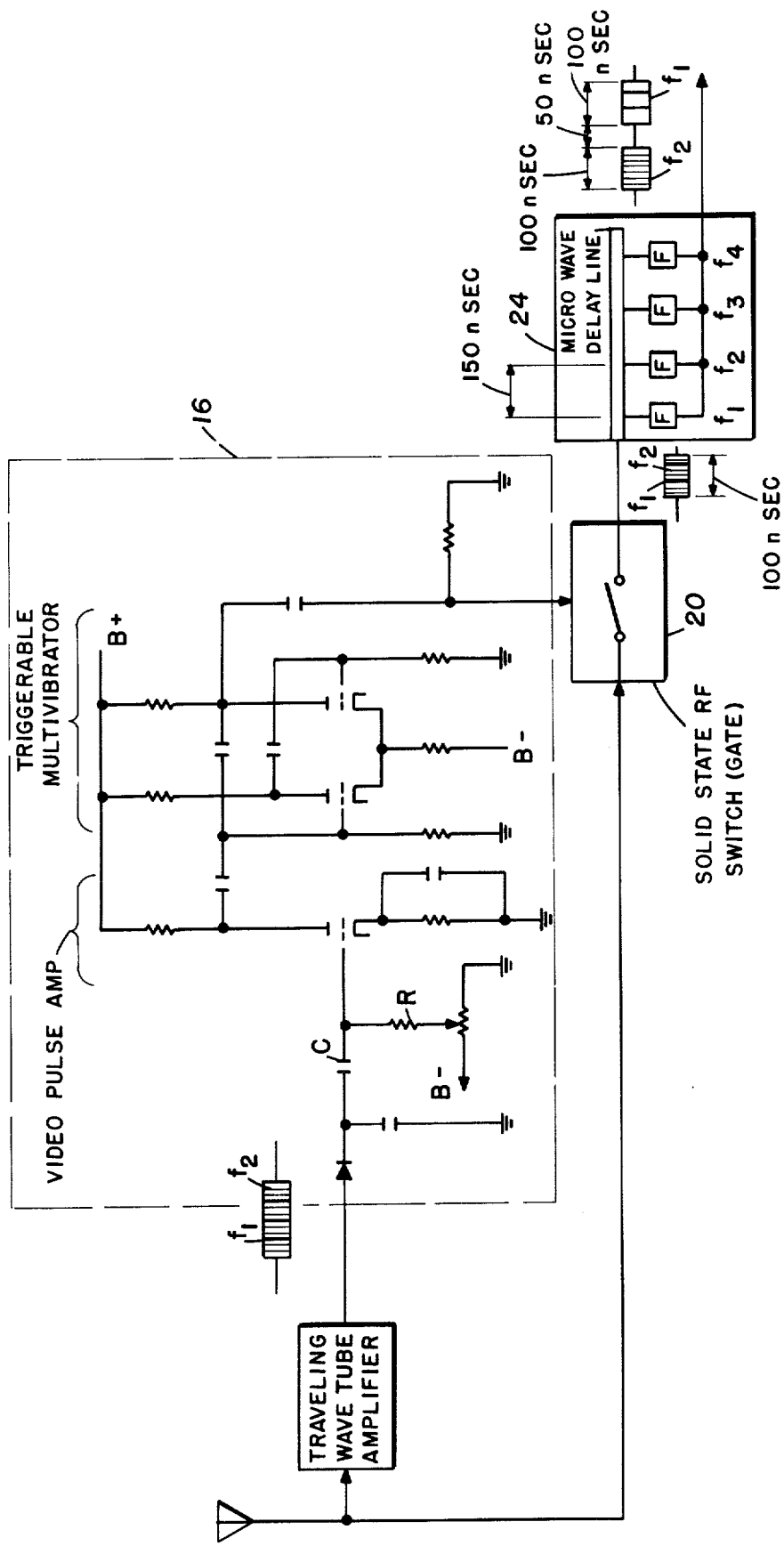
FIG. 2 shows the invention in detail with pulse processing steps described.

This short portion, which may represent one-tenth of a pulse of each frequency component in the input signal, is then fed on line 22 to a dispersive delay line 24 which operates in the conventional manner as previously described in the Summary of the Invention. Functionally, this portion must be short enough to insure that there is no overlap in the delay line, but long enough to permit recognition of the frequency. If, for example, only the first 100 nanoseconds of a dual frequency signal was permitted by the gate 20 to enter the delay line 24, and the delay line is constructed so that the first frequency required 150 nanoseconds longer to transmit than did the second frequency, then the dual frequency signals would now be in time sequence with no overlap See FIG. 2. The time sequential signals are fed on line 26 to a conventional instantaneous frequency measurement detector 28.

The instantaneous frequency measurement detector 28 operates in the aforementioned manner to produce two time sequential output pulses on line 30, one pulse for each frequency, with each pulse containing the correct information, i.e., amplitude, for its associated frequency. The signals on line 30 are fed to a double pulse detector device 32 which merely detects the presence of two pulses in close sequence. The double pulse detector 32 then produces a signal on line 34, which is indicative of the simultaneous receipt of a dual frequency signal, and which is fed to a digital computer 36. The signals on line 30 are also fed to a signal processor 38 where they are adjusted in amplitude and shape. The cleaned-up signals are then fed on line 40 to a parameter digitizer unit 42 which serves to translate the analog information of interest, i.e., that containing the values of the frequencies, into digital form suitable for use by a computer. The signal processor, 38, and digitizer 42, can be of the form of the Digitizer/Processor built by ARGO Systems and described in a paper presented by Richard Keenly at the "Microwave '73" Conference in Brighton, England.

This digital information is then fed on line 44 to the digital computer 36 where it becomes available for use by the computer 36 in determining the actual frequencies of the received signals. The computer 36 has already been advised by signals on line 34 from the double pulse detector 32, that a dual frequency signal is being processed. The computer 36 then arrives at the correct number for the frequencies and transmits, on line 46, these values to suitable display and control units 48. The display and control units 48 may display the information to an operator or may be connected to a jammer control unit for producing signals of identical frequency to those received at the antenna 10.

Various other modifications, adaptations and alterations are of course possible in light of the above teachings. Therefore, it should be understood at this time that within the scope of the appended claims the invention may be practiced otherwise than as specifically described.

What is claimed is:

1. Apparatus for measuring the frequencies of a plurality of simultaneously received pulse signals, comprising:

sampling means having an input connected to receive said plurality of simultaneously received pulse signals for sampling a portion substantially less than one pulse of each of said input signals, phase shifting means connected to receive said sampled signals from said sampling means for producing output signals each shifted in phase by an amount related to the magnitude of its corresponding frequency, and instantaneous frequency measurement means connected to receive said output signals from said phase shifting means for producing an output signal having a measurement of the frequency of each of said plurality of simultaneously received pulse signals encoded therein.

2. The apparatus of claim 1, wherein said sampling means comprises:

detector means for producing an output signal upon the detection of the leading edge of each of said plurality of simultaneously received pulse signals, and gate means connected to receive said output signal from said detector means for gating said plurality of simultaneously received signals upon the occurrence of said output signal from said detector means.

3. The apparatus of claim 2, wherein said phase shifting means comprises a dispersive delay line.

4. The apparatus of claim 3 wherein said dispersive delay line provides a phase shift of magnitude directly proportional to the magnitude of the frequency of said input signal.

5. In an instantaneous frequency measurement system adapted for receiving pulse signals, the improvement, whereby a plurality of pulse signals of unequal frequency may be simultaneously received and measured, comprising:

sampling means connected to receive said plurality of signals for producing therefrom sampled signals being substantially less than one pulse of each of said plurality of signals, and phase shifting means connected to receive said sampled signals from said sampling means for producing output signals representing output signals from said sampling means shifted in phase by an amount related to their frequency with said output signals from said pulse shifting means being connected to the input of said instantaneous frequency measurement system.

6. The apparatus of claim 5 wherein said sampling means comprises, detector means for producing an output signal upon the detection of the leading edge of a pulse of each of said plurality of pulse signals of unequal frequency, and gate means connected to receive said output signal from said sampling means for producing said output signal from said sampling means each time said output signal from said detector means occurs.

7. The apparatus of claim 6 wherein said phase shifting means comprises a dispersive delay line.

8. The apparatus of claim 7 wherein said dispersive delay line produces a phase shift directly proportional to frequency.

9. The apparatus of claim 8 wherein said output signals from said sampling means comprises one-tenth of one pulse of each of said plurality of signals.

* * * * *